United States Patent
Kurano et al.

(10) Patent No.: US 10,626,501 B2
(45) Date of Patent: Apr. 21, 2020

(54) HEATING DEVICE

(71) Applicant: NGK SPARK PLUG CO., LTD., Nagoya-shi, Aichi (JP)

(72) Inventors: Jun Kurano, Kiyosu (JP); Kazutaka Tanaka, Ogaki (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 210 days.

(21) Appl. No.: 15/706,309

(22) Filed: Sep. 15, 2017

(65) Prior Publication Data
US 2018/0087153 A1 Mar. 29, 2018

(30) Foreign Application Priority Data
Sep. 23, 2016 (JP) ................. 2016-185094

(51) Int. Cl.
*C23C 16/458* (2006.01)
*C23C 14/54* (2006.01)
*H01L 21/687* (2006.01)
*H01J 37/32* (2006.01)
*C23C 16/509* (2006.01)
*C23C 16/52* (2006.01)
*H01L 21/67* (2006.01)

(52) U.S. Cl.
CPC ........ *C23C 16/4586* (2013.01); *C23C 14/541* (2013.01); *C23C 16/5096* (2013.01); *C23C 16/52* (2013.01); *H01J 37/32532* (2013.01); *H01J 37/32724* (2013.01); *H01L 21/67103* (2013.01); *H01L 21/68792* (2013.01)

(58) Field of Classification Search
CPC ............................................... C23C 16/4586

USPC ........................................................ 118/725
See application file for complete search history.

(56) References Cited

U.S. PATENT DOCUMENTS

| 2003/0051665 A1* | 3/2003 | Zhao ................. C23C 16/45565 118/723 E |
| 2007/0044718 A1* | 3/2007 | Natsuhara ......... H01L 21/67103 118/725 |

FOREIGN PATENT DOCUMENTS

JP 4485681 B2 6/2010

* cited by examiner

*Primary Examiner* — Elizabeth A Burkhart
(74) *Attorney, Agent, or Firm* — Stites & Harbison, PLLC; Jeffrey A. Haeberlin; James R. Hayne

(57) ABSTRACT

A heating device includes a holding member having a resistive heating element, a columnar support member joined to the holding member, power receiving electrodes connected to the resistive heating element, and an electrode terminal unit disposed in each of through holes in the columnar support member. Each of the electrode terminal units includes a first columnar member having one end portion connected to the power receiving electrode and the other end portion connected to a metal stranded wire, and a second columnar member having an end portion connected to the metal stranded wire. A columnar member assembly having a portion of the first columnar member and a portion of the second columnar member includes a general portion and a large-diameter portion. The distance between the large-diameter portion and an inner peripheral surface of the through hole is smaller than the distance between the general portion and the inner peripheral surface.

11 Claims, 11 Drawing Sheets

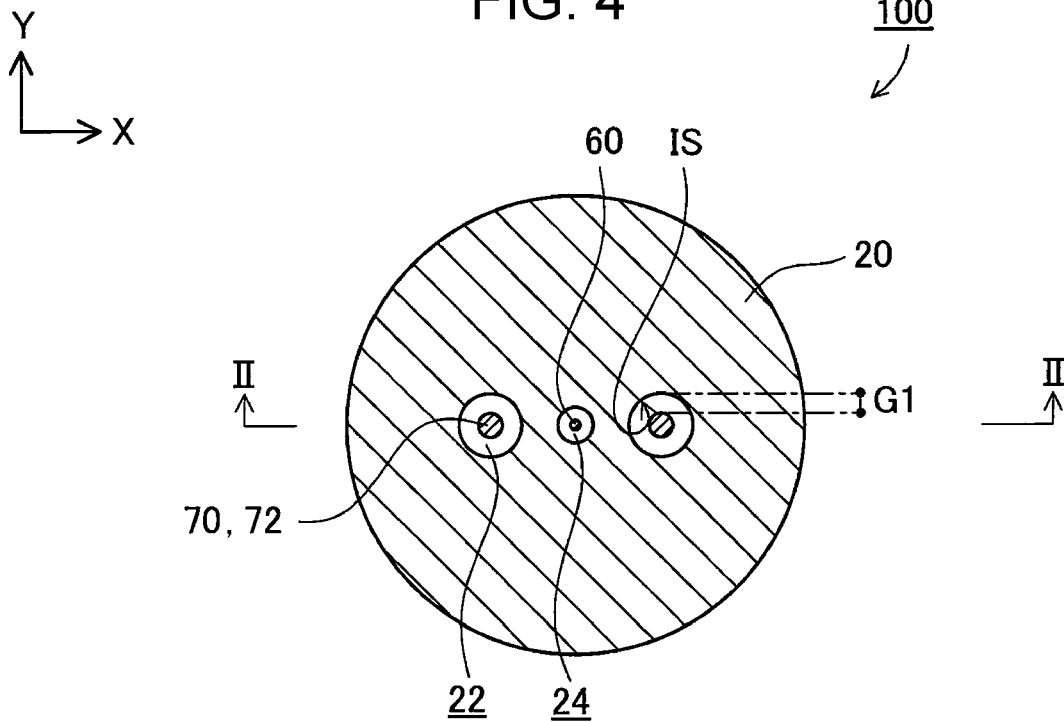
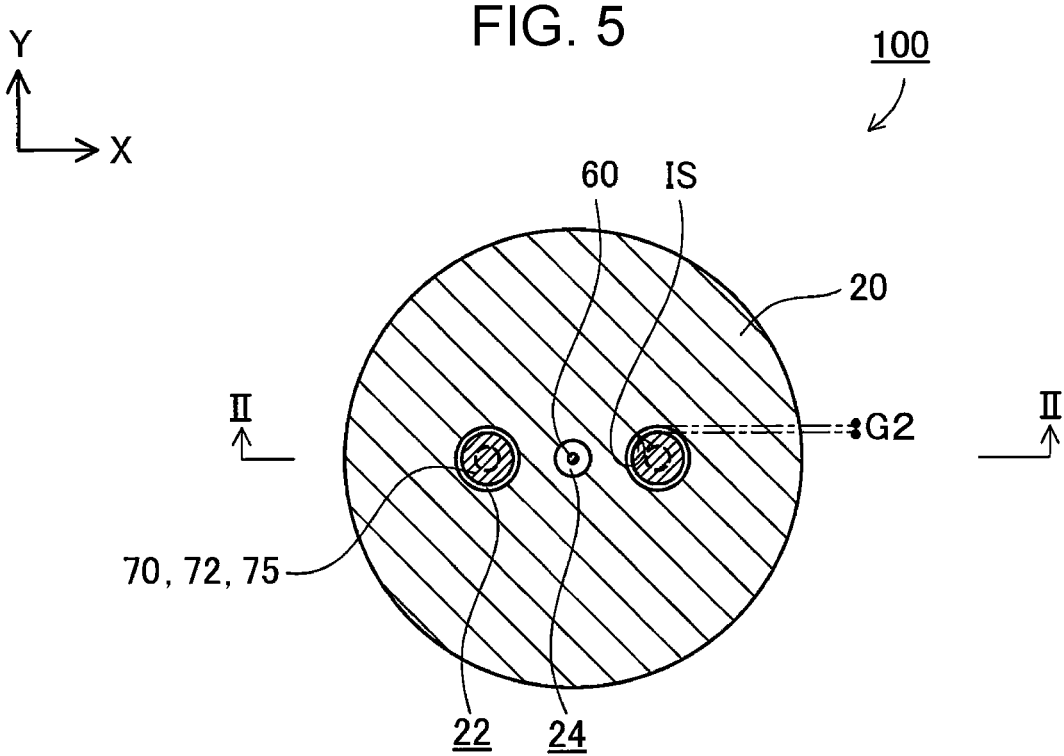

HEATING DEVICE

CROSS REFERENCE TO RELATED APPLICATION

The present application claims priority to Japanese Patent No. 2016-185094, which was filed on Sep. 23, 2016, the disclosure of which is herein incorporated by reference in its entirety.

BACKGROUND OF THE INVENTION

Field of the Invention

The technology disclosed herein relates to a heating device.

Description of Related Art

Heating devices (also referred to as "susceptors") for heating an object (for example, a semiconductor wafer), while holding the object, to a predetermined treatment temperature (for example, about 400 to 650° C.) have been developed. The heating device is used, for example, as a part of a semiconductor manufacturing apparatus such as a film deposition apparatus (for example, a CVD apparatus or a sputtering apparatus) and etching equipment (for example, plasma etching equipment).

In general, a heating device includes a plate-like holding member having a holding surface and a back surface which are substantially orthogonal to a predetermined direction (hereinafter referred to as a "first direction") and a columnar support member which extends in the first direction and is joined to the back surface of the holding member (refer to, for example, PTL 1). A resistive heating element is disposed inside the holding member, and a plurality of power receiving electrodes (electrode pads) electrically connected to the resistive heating element are disposed on the back surface side of the holding member. In addition, the columnar support member has a plurality of through holes each having an opening on the back surface side of the holding member. Each of the through holes accommodates an electrode terminal joined to one of the power-receiving electrodes by, for example, brazing. When a voltage is applied to the resistive heating element via the electrode terminal and the power receiving electrode, the resistive heating element generates heat and, thus, the object (for example, a semiconductor wafer) held on the holding surface of the holding member is heated to, for example, about 400 to 650° C.

Patent Literature

PTL 1 is Japanese Patent No. 4485681.

BRIEF SUMMARY OF THE INVENTION

In recent years, to fabricate a finer pattern and increase yield in a semiconductor manufacturing process, there has been a growing demand for improvement in the uniformity of temperature across the holding surface of the heating device (the surface thermal uniformity). In general, since heat generated by the resistive heating element inside the holding member escapes through each of members (for example, electrode terminals) (hereinafter, this phenomenon is referred to as "heat escape"), it is desirable that the diameter of the electrode terminal be minimized to improve the surface thermal uniformity. However, if the diameter of the electrode terminal is reduced, the size of the joint portion (the brazed portion) between the electrode terminal and the power receiving electrode is reduced. Thus, if the electrode terminal having relatively large length swings, the stress (the moment) is generated in the joint portion and, thus, the stress may damage the joint portion. As described above, in conventional heating devices, there is room for improvement both in achieving the thermal uniformity of the holding surface and in suppressing the damage to the joint portion between the electrode terminal and the power receiving electrode.

Accordingly, a technology capable of removing the above-mentioned situation is provided.

The technology described herein can be provided in the form of the following embodiments, for example.

(1) A heating device for heating an object is disclosed herein. The heating device includes a holding member in a shape of a plate with first and second surfaces substantially orthogonal to a first direction, where the holding member has a resistive heating element thereinside and the object is held on the first surface of the holding member, a columnar support member in a columnar shape extending in the first direction, where the columnar support member is joined to the second surface of the holding member and has a plurality of through holes each having an opening on the second surface side of the holding member (i.e., the columnar support member includes a plurality of inner peripheral surfaces defining the plurality of through holes), a plurality of power receiving electrodes disposed on the second surface side of the holding member and electrically connected to the resistive heating element, and a plurality of electrode terminal units each disposed in one of the through holes formed in the columnar support member and electrically connected to one of the power receiving electrodes. Each of the electrode terminal units includes a metal stranded wire, a first columnar member disposed closer to the holding member than the metal stranded wire (i.e., the metal stranded wire is disposed farther away from the holding member than the first columnar member), and a second columnar member disposed farther away from the holding member than the metal stranded wire. The first columnar member is a conductive member in a columnar shape, one end portion of the first columnar member on the holding member side is joined to the power receiving electrode via a brazing filler metal, and the other end portion is joined to the metal stranded wire. The second columnar member is a conductive member in a columnar shape, and one end portion of the second columnar member on the holding member side is joined to the metal stranded wire. In at least one of the electrode terminal units, a columnar member assembly including a portion of the first columnar member other than a joint portion between the first columnar member and the power receiving electrode and a joint portion between the first columnar member and the metal stranded wire and a portion of the second columnar member other than a joint portion between the second columnar member and the metal stranded wire has a general portion and a large-diameter portion having a diameter in a predetermined direction larger than the general portion. A distance between a surface of the large-diameter portion and the inner peripheral surface of the respective through hole is smaller than a distance between a surface of the general portion and the inner peripheral surface of the respective through hole. According to the heating device, since the columnar member assembly of each of the electrode terminal units has the large-diameter portion, excessive swinging of each of the electrode terminal units can be reduced due to interference between the large-diameter portion and the inner peripheral surface of the through hole. In addition, since the diameter of the general portion of the columnar member assembly is relatively small, the amount of heat that escapes via each of the electrode terminal units can be reduced. Consequently, according to the heating device, a decrease in the surface thermal uniformity can be suppressed by reducing the amount of heat that escapes via each of the electrode terminal units. At the same time, excessive swinging of each of the electrode terminal unit can be reduced and, thus, the stress of the joint portion between the electrode terminal unit and the power receiving electrode can be reduced. As a result, damage to the joint portion can be suppressed.

(2) In the above-described heating device, each of the first columnar member and the second columnar member may have a substantially cylindrical shape, at least one of the first columnar member and the second columnar member may have a flange portion, the flange portion may protrude in a direction perpendicular to an extending direction of the one of the first columnar member and the second columnar member, and the large-diameter portion may be a portion where the flange portion is formed (i.e., the large-diameter portion may comprise the flange portion). According to the heating device, a decrease in the surface thermal uniformity of the first surface can be suppressed by effectively reducing the amount of heat that escapes via each of the electrode terminal units. At the same time, excessive swinging of each of the electrode terminal units can be prevented and, thus, damage to the joint portion can be reduced. In addition, since the stress of the joint portion between the power receiving electrode and each of the electrode terminal units is reduced, damage to the joint portion can be reduced.

(3) In the above-described heating device, the flange portion may be formed in a center portion among three portions defined by equally dividing the one of the first columnar member and the second columnar member in the extending direction. According to the heating device, unlike the configuration in which the flange portion is formed at an end portion of the above-mentioned three portions, swing of each of the electrode terminal units can be effectively reduced by the flange portion. Thus, damage to the joint portion between the power receiving electrode and each of the electrode terminal units can be effectively reduced.

(4) In the above-described heating device, the first columnar member and the second columnar member may have substantially cylindrical shapes with diameters different from each other, and the large-diameter portion may be one of the first columnar member and the second columnar member, which has a diameter larger than the other thereof. In other words, the first columnar member may have a first diameter, the second columnar may have a second diameter different from the first diameter, and the large-diameter portion may comprise the one of the first columnar member and the second columnar member which has a larger diameter. According to the heating device, by simply increasing the diameter of the first columnar member or the second columnar member without forming the flange portion, the columnar member assembly of each of the electrode terminal units can be easily provided with the large-diameter portion. As a result, the manufacturing process can be simplified and sped up and, thus, the manufacturing cost can be reduced.

(5) In the above-described heating device, the large-diameter portion may not be formed in the first columnar member and may be formed in the second columnar member. In other words, the large-diameter portion may consist of the second columnar member. According to the heating device, since the large-diameter portion is provided in the second columnar member which is unsusceptible to, for example, the difference in amount of thermal expansion, interference of the large-diameter portion with the inner peripheral surface of the through hole can be reduced when each of the electrode terminal units slightly swings and, thus, damage to each of the electrode terminal units can be reduced.

(6) In the above-described heating device, the length of the first columnar member in the extending direction may be smaller than the length of the second columnar member in the extending direction. In other words, the first columnar member may have a first length in the extending direction and the second columnar member may have a second length in the extending direction larger than the first length. According to the heating device, the metal stranded wire is disposed relatively close to the holding member that is heated to a high temperature and, thus, the stress generated in the electrode terminal unit due to the influence of the difference in amount of thermal expansion or the like can be effectively reduced by the metal stranded wire. As a result, the occurrence of damage to each of the electrode terminal units can be effectively reduced.

(7) In the above-described heating device, the distance between the surface of the large-diameter portion and the inner peripheral surface of the through hole may be 0.1 mm or greater and 2 mm or less. According to the heating device, the occurrence of damage to the electrode terminal unit caused by interference between the large-diameter portion and the inner peripheral surface of the through hole due to the difference in amount of thermal expansion or the like can be reduced. At the same time, excessive swinging of the electrode terminal unit can be prevented.

(8) In the above-described heating device, the columnar support member may be a single ceramic member having the plurality of through holes formed (i.e., defined) therein. According to the heating device, the number of parts can be reduced as compared to, for example, a configuration in which a plurality of similar through holes are formed by using a plurality of insulating tubes arranged in a hollow portion of a tubular ceramic body. In addition, the load imposed on each of the electrode terminal units due to swing of the insulating tube can be eliminated and, thus, the occurrence of damage to each of the electrode terminal units can be reduced. Furthermore, the joint area between the columnar support member and the holding member can be increased and, thus, the two members can be firmly joined to each other.

(9) A heating device for heating an object is disclosed herein. The heating device includes a holding member in a shape of a plate with first and second surfaces substantially orthogonal to a first direction, where the holding member has a resistive heating element thereinside and the object is held on the first surface of the holding member, a columnar support member in a columnar shape extending in the first direction, where the columnar support member is joined to the second surface of the holding member and has a plurality of through holes each having an opening on the second surface side of the holding member (i.e., the columnar support member includes a plurality of inner peripheral surfaces defining the plurality of through holes), a plurality of power receiving electrodes that are disposed on the second surface side of the holding member and that are electrically connected to the resistive heating element, and a plurality of electrode terminal units each disposed in one of the through holes formed in the columnar support member and electrically connected to one of the power receiving electrodes. Each of the electrode terminal units includes a metal stranded wire, a first columnar member disposed closer to the holding member than the metal stranded wire (i.e., the metal stranded wire is disposed farther away from the holding member than the first columnar member), and a second columnar member disposed farther away from the holding member than the metal stranded wire. The first columnar member is a conductive member in a columnar shape. One end portion of the first columnar member on the holding member side is joined to the power receiving electrode via a brazing filler metal, and the other end portion is joined to the metal stranded wire. The second columnar member is a conductive member in a columnar shape. One end portion of the second columnar member on the holding member side is joined to the metal stranded wire. In at least one of the through holes, a convex portion is formed on part of the inner peripheral surface that faces a columnar member structure including the second columnar member and a portion of the first columnar member other than a joint portion between the first columnar member and the power receiving electrode. In other words, at least one of the plurality of inner peripheral surfaces includes a convex portion that faces a columnar member structure including the second columnar member and a portion of the first columnar member other than a joint portion between the first columnar member and the power receiving electrode. A distance between a surface of the convex portion and the columnar member structure is smaller than a distance between the inner peripheral surface of the through hole other than the convex portion and the columnar member structure. According to the heating device, in at least one of the through holes, the convex portion is formed on part of the inner peripheral surface that faces a columnar member structure (the structure including the second columnar member and a portion of the first columnar member other than a joint portion between the first columnar member and the power receiving electrode), and the distance between a surface of the convex portion and the columnar member structure is smaller than the distance between the inner peripheral surface of the through hole other than the convex portion and the columnar member structure. According to the heating device, excessive swinging of each of the electrode terminal units can be prevented due to interference between the columnar member structure and the convex portion without increasing the diameter of the columnar member structure. Thus, according to the heating device, by reducing the amount of heat that escapes through each of the electrode terminal units, a decrease in the surface thermal uniformity of the first surface can be suppressed. At the same time, excessive swinging of each of the electrode terminal unit can be prevented and, thus, the stress of the joint portion between the power receiving electrode and each of the electrode terminal units can be reduced. As a result, damage to the joint portion can be reduced.

Note that the technology disclosed herein can be realized in various forms and, for example, the technology can be realized in the form of a heating device, a semiconductor manufacturing device, a manufacturing method thereof, or the like.

BRIEF DESCRIPTION OF THE DRAWINGS

Illustrative aspects of the invention will be described in detail with reference to the following figures wherein:

FIG. 4 is a schematic illustration of the cross-sectional configuration of the heating device according to the first embodiment.

FIG. 5 is a schematic illustration of the cross-sectional configuration of the heating device according to the first embodiment.

DETAILED DESCRIPTION OF EXEMPLARY EMBODIMENTS OF THE INVENTION

A. First Embodiment

A-1. Configuration of Heating Device

Figure 1:
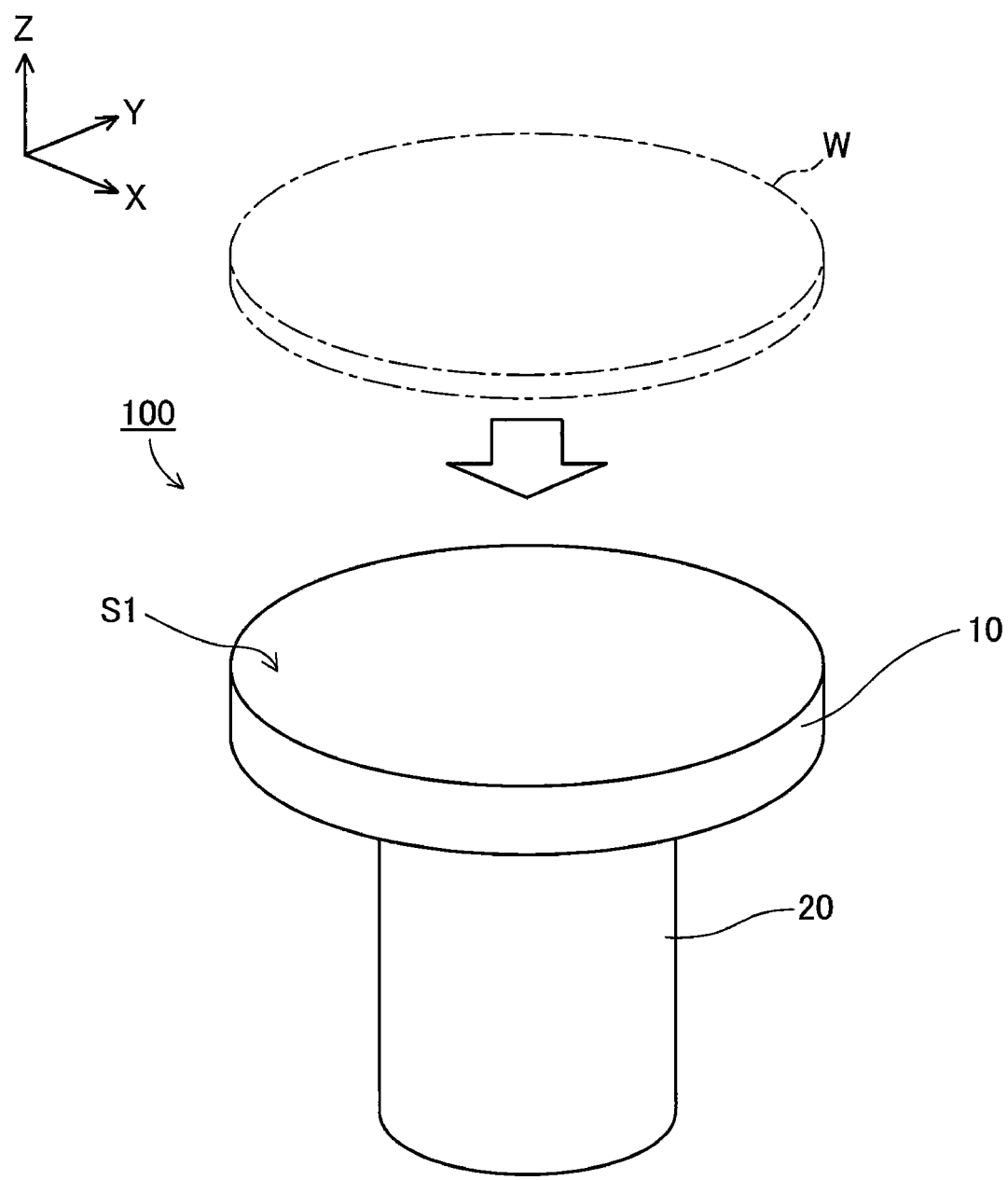
FIG. 1 is a perspective view schematically illustrating the external configuration of a heating device according to a first embodiment.
Figure 2:
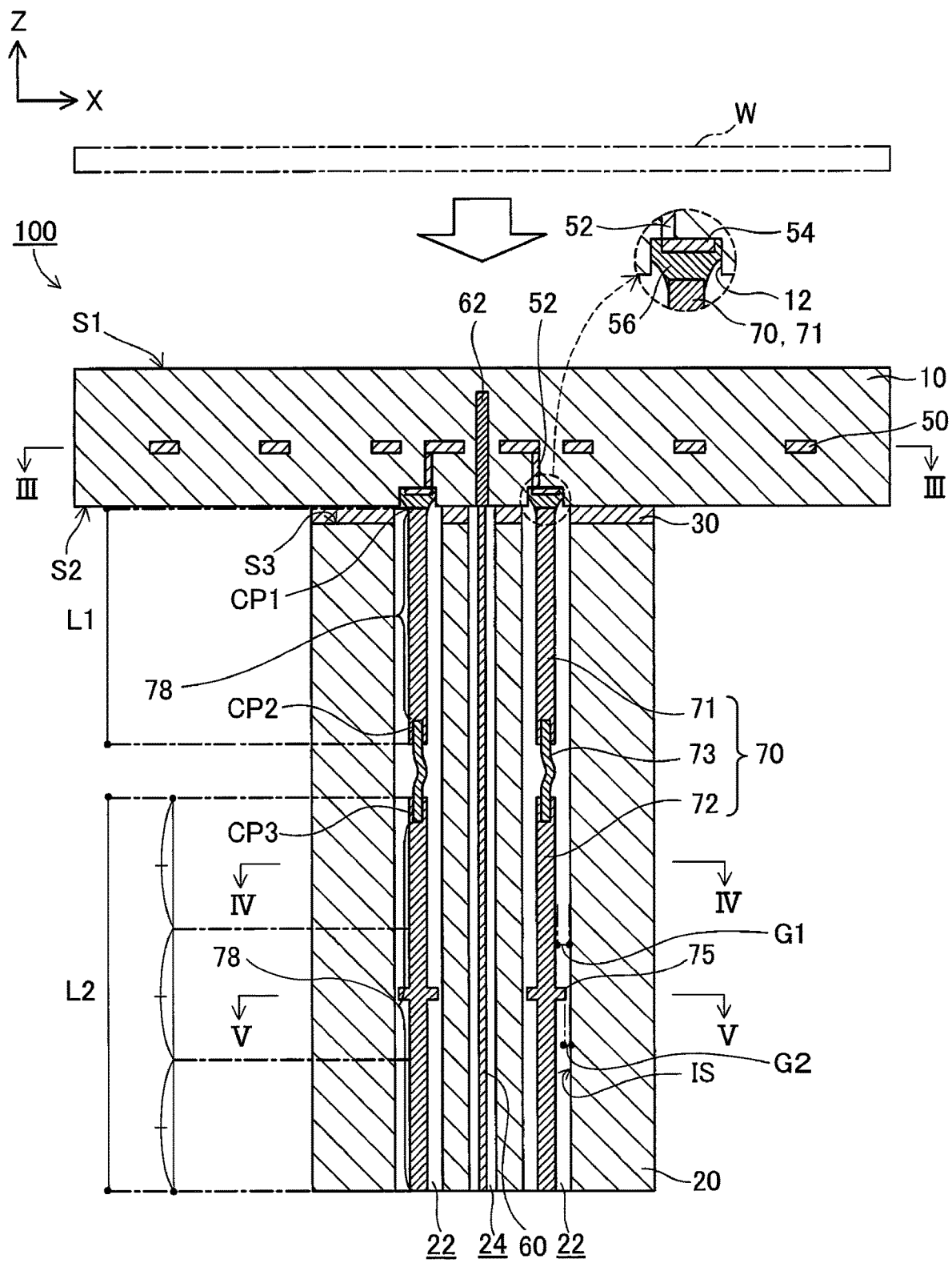
FIG. 2 is a schematic illustration of the cross-sectional configuration of the heating device according to the first embodiment.
Figure 3:
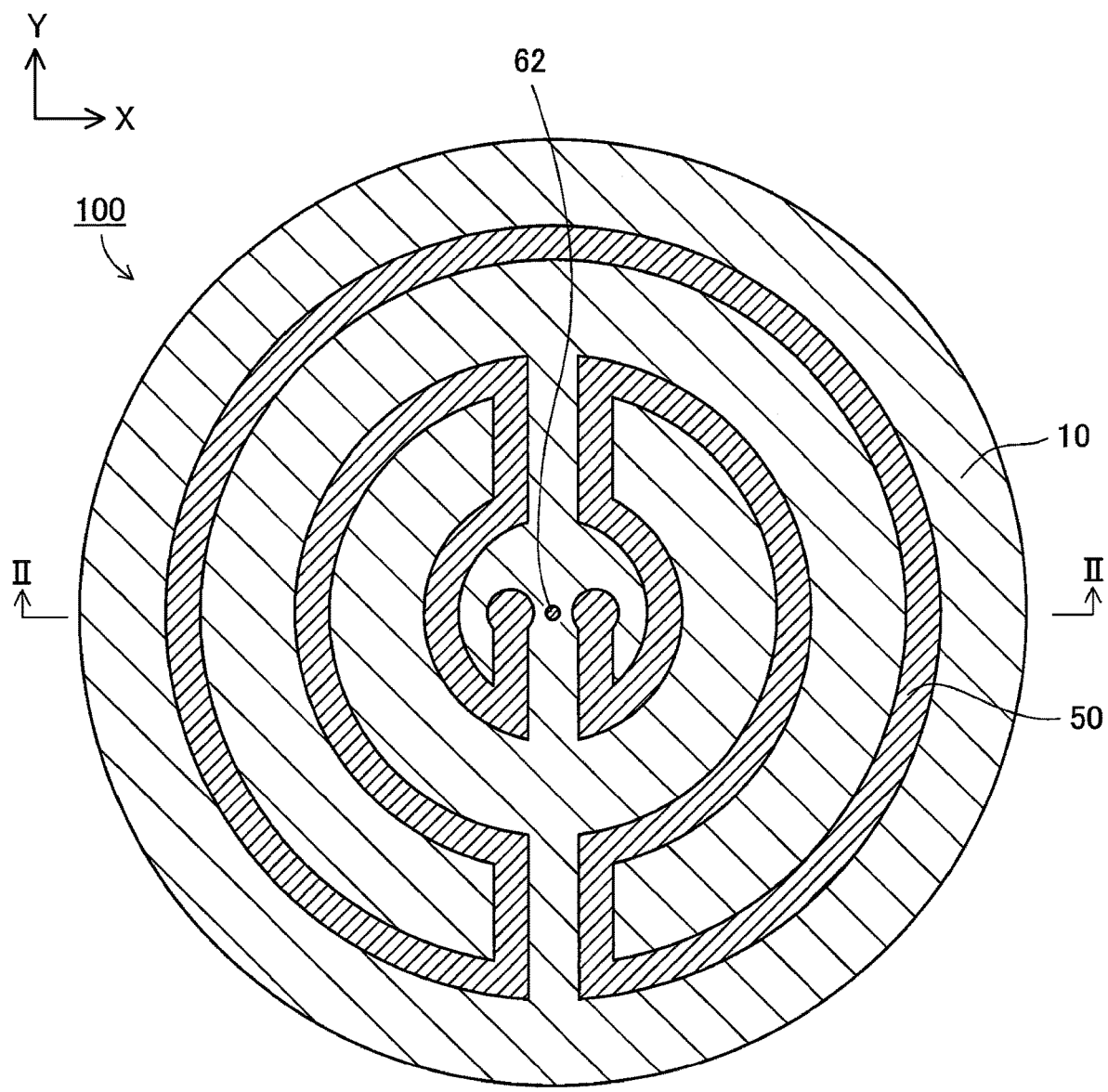
FIG. 3 is a schematic illustration of the cross-sectional configuration of the heating device according to the first embodiment.

FIG. 1 is a perspective view schematically illustrating the external configuration of a heating device 100 according to a first embodiment. FIGS. 2 to 5 are schematic illustrations of the cross-sectional configuration of the heating device 100 according to the first embodiment. FIG. 2 illustrates the XZ cross-sectional configuration of the heating device 100 taken along line II-II in FIGS. 3 to 5. FIG. 3 illustrates the XY cross-sectional configuration of the heating device 100 taken along line III-III in FIG. 2. FIG. 4 illustrates the XY cross-sectional configuration of the heating device 100 taken along line IV-IV in FIG. 2. FIG. 5 illustrates the XY cross-sectional configuration of the heating device 100 taken along line V-V in FIG. 2. Note that an enlarged view of a portion around a power receiving electrode 54 (described below) is included in FIG. 2. In each of FIGS. 1 to 5, the X, Y, and Z axes which are orthogonal to one another are illustrated to identify the directions. As used herein, for convenience of description, the positive Z-axis direction is referred to as an "upward direction", and the negative Z-axis direction is referred to as a "downward direction". However, in practice, the heating device 100 may be installed in a direction that differs from a direction defined by such directions. The same applies to FIG. 6 and the subsequent figures.

The heating device 100 is a device that holds an object (for example, a semiconductor wafer W) and heats the object to a predetermined processing temperature (for example, about 400 to 650° C.). A heating device is also referred to as a "susceptor". For example, the heating device 100 is used as a part of a semiconductor manufacturing apparatus, such as a deposition apparatus (for example, a CVD apparatus or a sputtering deposition apparatus) or an etching apparatus (for example, a plasma etching apparatus).

As illustrated in FIGS. 1 and 2, the heating device 100 includes a holding member 10 and a columnar support member 20.

The holding member 10 is a substantially disk-shaped member having a holding surface S1 and a back surface S2 which are substantially orthogonal to a predetermined direction (the vertical direction according to the present embodiment). The holding member 10 is made of, for example, ceramic mainly containing AlN (aluminum nitride) or $Al_2O_3$ (alumina). The term "mainly containing XXX" as used herein means that the content of XXX is the highest (by weight). The diameter of the holding member 10 is, for example, about 100 mm or greater and about 500 mm or less, and the thickness (the length in the vertical direction) of the holding member 10 is, for example, about 3 mm or greater and about 10 mm or less. The predetermined direction (the vertical direction) corresponds to a "first direction" in the claims, the holding surface S1 of the holding member 10 corresponds to a "first surface" in the claims, and the back surface S2 of the holding member 10 corresponds to a "second surface" in the claims.

The columnar support member 20 is a member having a substantially cylindrical shape and extending in the predetermined direction (the vertical direction). Like the holding member 10, the columnar support member 20 is formed of ceramic mainly containing AlN or $Al_2O_3$, for example. The columnar support member 20 has an outer diameter of, for example, about 30 mm or greater and about 90 mm or less, and the columnar support member 20 has a height (the length in the vertical direction) of, for example, about 100 mm or greater and about 300 mm or less.

The holding member 10 and the columnar support member 20 are disposed such that the back surface S2 of the holding member 10 and an upper surface S3 of the columnar support member 20 face each other in the vertical direction. The columnar support member 20 is joined to the center portion or the vicinity of the center portion of the back surface S2 of the holding member 10 via a joining layer 30 made of a known jointing material.

As illustrated in FIGS. 2 and 3, a resistive heating element 50 which functions as a heater for heating the holding member 10 is disposed inside the holding member 10. The resistive heating element 50 is formed of a conductive material, such as tungsten or molybdenum. According to the present embodiment, the resistive heating element 50 forms a linear pattern extending substantially concentrically as viewed from the Z-axis direction. Both end portions of the linear pattern of the resistive heating element 50 are located in the vicinity of the center portion of the holding member 10. The upper end portion of a via conductor 52 is connected to each of the end portions. A pair of concave portions 12 are formed on the back surface S2 of the holding member 10, and a power receiving electrode (an electrode pad) 54 is provided in each of the concave portions 12. The lower end portion of the via conductor 52 is connected to the power receiving electrode 54. As a result, the resistive heating element 50 and the power receiving electrode 54 are electrically connected via the via conductor 52.

As illustrated in FIGS. 2, 4, and 5, a pair of electrode through holes 22 each having an opening on the back surface S2 side of the holding member 10 is formed in the columnar support member 20. Each of the electrode through holes 22 is a hole having a substantially circular cross-section and extending in a direction substantially the same as the vertical direction. The electrode through hole 22 has a substantially constant inner diameter throughout the length thereof in the extending direction. Each of the electrode through holes 22 has an electrode terminal unit 70 disposed therein. As illustrated in FIG. 2, the upper end portion of the electrode terminal unit 70 (more specifically, the upper end portion of a first columnar member 71 described below) is electrically connected to the power receiving electrode 54 via a brazing filler metal 56 (for example, gold brazing filler metal). When a voltage is applied from a power source (not illustrated) to the resistive heating element 50 via each of the electrode terminal units 70, each of the power receiving electrodes 54, and each of the via conductors 52, the resistive heating element 50 generates heat and, thus, an object (for example, the semiconductor wafer W) held on the holding surface S1 of the holding member 10 is heated to a predetermined temperature (for example, about 400 to 650° C.). The configuration of the electrode terminal unit 70 is described in detail below.

The columnar support member 20 further has a temperature sensing element through hole 24 formed therein. The temperature sensing element through hole 24 has an opening on the back surface S2 side of the holding member 10. Like the electrode through hole 22, the temperature sensing element through hole 24 is a hole having a substantially circular cross-section and extending substantially in a direction the same as the vertical direction. The temperature sensing element through hole 24 has a substantially constant inner diameter throughout the length thereof in the extending direction. The temperature sensing element through hole 24 has a temperature sensing element 60 disposed therein. Examples of the temperature sensing element 60 include a thermocouple or a platinum resistive element. An upper end portion 62 of the temperature sensing element 60 is embedded in the center portion of the holding member 10. The temperature of the holding member 10 is measured by the temperature sensing element 60 and, thus, the temperature of the holding surface S1 of the holding member 10 is controlled on the basis of the result of measurement.

A-2. Method for Manufacturing Heating Device

An example of a method for manufacturing the heating device 100 is described below. The holding member 10 and the columnar support member 20 are produced first.

An example of a method for manufacturing the holding member 10 is as follows. An organic solvent, such as toluene, is added to a mixture obtained by adding 1 part by weight of yttrium oxide ($Y_2O_3$) powder, 20 parts by weight of an acrylic binder, and an appropriate amount of a dispersant and a plasticizer to 100 parts by weight of aluminum nitride powder. Thereafter, the mixture is mixed by a ball mill to produce a slurry for a green sheet. The slurry for a green sheet is formed into a sheet shape by a casting apparatus and, thereafter, is dried to produce a plurality of green sheets.

In addition, a conductive powder, such as tungsten or molybdenum powder, is added to a mixture of aluminum nitride powder, acrylic binder, and organic solvents such as terpineol. Thereafter, the mixture is kneaded to produce a metallized paste. By printing the metallized paste by using, for example, a screen printing apparatus, an unsintered conductor layer is formed on a particular green sheet. The unsintered conductor layer is used to form, for example, the resistive heating element 50 or the power receiving electrode 54 afterward. In addition, by printing the metallized paste on a green sheet having a via hole formed in advance, an unsintered conductor portion to be used as a via conductor 52 afterward is formed.

Subsequently, a plurality of such green sheets (for example, 20 green sheets) are thermocompression-bonded. The outer circumference is cut out as needed. In this manner, a green sheet laminate is produced. The green sheet laminate is cut into a disk-shaped molded body by machining. Thereafter, the molded body is degreased, and the degreased molded body is sintered to produce a sintered body. The surface of the sintered body is polished. Through the above-described steps, the holding member 10 is manufactured.

In addition, an example of a method for manufacturing the columnar support member 20 is as follows. That is, an organic solvent, such as methanol, is added to a mixture obtained by adding 1 part by weight of yttrium oxide powder, 3 parts by weight of PVA binder, and an appropriate amount of dispersant and plasticizer to 100 parts by weight of aluminum nitride powder first. The mixture is blended in a ball mill to obtain slurry. The slurry is granulated by using a spray dryer to produce raw material powder. Subsequently, a rubber mold having core cylinders corresponding to the electrode through holes 22 and the temperature sensing element through hole 24 arranged therein is filled with the raw material powder, and cold isostatic pressing is performed to obtain a compact. The obtained compact is degreased, and the degreased body is sintered. Through the above-described steps, the columnar support member 20 is produced.

Subsequently, the holding member 10 and the columnar support member 20 are joined to each other. A lapping process is performed on the back surface S2 of the holding member 10 and the upper surface S3 of the columnar support member 20 as necessary. Thereafter, a known joining material prepared by mixing, for example, rare earth and an organic solvent into a paste is uniformly applied to at least one of the back surface S2 of the holding member 10 and the upper surface S3 of the columnar support member 20. Thereafter, a degreasing treatment is performed. Subsequently, the back surface S2 of the holding member 10 and the upper surface S3 of the columnar support member 20 are overlapped, and the holding member 10 and the columnar support member 20 are joined by performing hot press sintering.

After the holding member 10 and the columnar support member 20 are joined to each other, each of the electrode terminal units 70 is inserted into one of the electrode through holes 22, and the upper end portion of the electrode terminal units 70 (more specifically, the first columnar member 71 described below) is brazed to one of the power receiving electrodes 54 with, for example, a gold brazing filler metal. In addition, the temperature sensing element 60 is inserted into the temperature sensing element through hole 24, and the upper end portion 62 of the temperature sensing element 60 is fixedly embedded. By employing the above-described manufacturing method, the heating device 100 having the above-described configuration is manufactured.

A-3. Detailed Configuration of Electrode Terminal Unit

The configuration of the electrode terminal unit 70 is described in detail below. As illustrated in FIG. 2, each of the electrode terminal units 70 includes the first columnar member 71, a second columnar member 72, and a metal stranded wire 73.

The first columnar member 71 is a conductive member having a substantially cylindrical shape. The first columnar member 71 is disposed closer to the holding member 10 than the metal stranded wire 73 (that is, on the upper side with respect to the metal stranded wire 73). The first columnar member 71 is made of, for example, nickel. As described above, one end portion of the first columnar member 71 on the holding member 10 side is joined to the power receiving electrode 54 via the brazing filler metal 56. In addition, the other (lower) end portion of the first columnar member 71 is joined to the metal stranded wire 73. According to the present embodiment, the first columnar member 71 and the metal stranded wire 73 are joined to each other by caulking. Hereinafter, a joint portion of the first columnar member 71 with the power receiving electrode 54 is referred to as a joint portion CP1, and a joint portion of the first columnar member 71 with the metal stranded wire 73 is referred to as a joint portion CP2. The diameter of the first columnar member 71 is substantially uniform (for example, 3 mm or greater and 6 mm or less) at least throughout the portion other than the joint portion CP1 and the joint portion CP2. The diameters of the joint portion CP1 and the joint portion CP2 may be substantially the same as the diameter of the other portion or may be different from the diameter of the other portion.

The second columnar member 72 is a conductive member having a substantially cylindrical shape. The second columnar member 72 is disposed farther away from the holding member 10 than the metal stranded wire 73 (that is, on the lower side with respect to the metal stranded wire 73). Like the first columnar member 71, the second columnar member 72 is made of, for example, nickel. One end portion of the second columnar member 72 on the holding member 10 side is joined to the metal stranded wire 73. The second columnar member 72 and the metal stranded wire 73 are joined to each other by caulking. Hereinafter, a joint portion of the second columnar member 72 with the metal stranded wire 73 is referred to as a joint portion CP3. The other (lower) end portion of the second columnar member 72 protrudes below the columnar support member 20 and is connected to a power source (not illustrated) directly or via another member. The diameter of the second columnar member 72 is substantially uniform (for example, 3 mm or greater and 6 mm or less) at least throughout the portion other than the joint portion CP3 and a flange portion 75 (described below). The diameter of the joint portion CP3 may be substantially the same as the diameter of the other portion or may be different from the diameter of the other portion.

The metal stranded wire 73 is a stranded wire having a certain degree of flexibility. The metal stranded wire 73 is made of, for example, nickel. The diameter of the metal stranded wire 73 is, for example, 1 mm or greater and 3 mm or less. During use of the heating device 100, the temperature of the holding member 10 is increased by the heat generated by the resistive heating element 50. Thus, a difference in amount of thermal expansion occurs between the holding member 10 and the columnar support member 20 and between the first columnar member 71 which is relatively close to the holding member 10 and the second columnar member 72 which is relatively farther away from the holding member 10. Due to difference in amount of thermal expansion, stress is generated in the electrode terminal unit 70. Since the metal stranded wire 73 constituting the electrode terminal unit 70 has a certain degree of flexibility, the stress generated in the electrode terminal unit 70 can be absorbed or relaxed. According to the present embodiment, a length L1 of the first columnar member 71 in the extending direction is shorter than a length L2 of the second columnar member 72 in the extending direction.

Therefore, in each of the electrode terminal units 70, the metal stranded wire 73 is located relatively close to the holding member 10.

Hereinafter, in each of the electrode terminal units 70, a portion of the first columnar member 71 other than the joint portion CP1 between the first columnar member 71 and the power receiving electrode 54 and the joint portion CP2 between the first columnar member 71 and the metal stranded wire 73 and a portion of the second columnar member 72 other than the joint portion CP3 between the second columnar member 72 and the metal stranded wire 73 is collectively referred to as a columnar member assembly 78.

According to the heating device 100 of the present embodiment, as illustrated in FIG. 2, a flange portion 75 protruding in a direction orthogonal to the extending direction of the second columnar member 72 is formed in the second columnar member 72. The protrusion length of the flange portion 75 is, for example, 1 mm or greater and 3 mm or less, and the thickness of the flange portion 75 (the length in the extending direction of the second columnar member 72) is, for example, 0.1 mm or greater and 1.0 mm or less. The flange portion 75 is formed in a center portion among three portions defined by equally dividing the second columnar member 72 in the extending direction. In addition, as illustrated in FIG. 5, the flange portion 75 is formed around the entire circumference of the second columnar member 72 as viewed from the Z-axis direction. As described above, the flange portion 75 is formed in the columnar member assembly 78, and the flange portion 75 is a portion having a diameter larger than the diameter of a portion (hereinafter referred to as a "general portion") of the columnar member assembly 78 other than the flange portion 75. The second columnar member 72 having the flange portion 75 is produced by, for example, cutting work. Alternatively, the second columnar member 72 having the flange portion 75 is produced by joining a separately prepared flange portion 75 to a columnar member, for example, by welding. The flange portion 75 corresponds to a "large-diameter portion" in the claims, and the general portion of the columnar member assembly 78 (the portion other than the flange portion 75) corresponds to a "general portion" in the claims.

According to the present embodiment, each of the electrode through holes 22 is a hole having a substantially constant inner diameter throughout its length in the extending direction. The diameter of the portion of the second columnar member 72 other than the flange portion 75 is substantially the same as the diameter of the first columnar member 71. Accordingly, a distance G2 (refer to FIGS. 2 and 5) between the surface of the flange portion 75 and an inner peripheral surface IS of the electrode through hole 22 is smaller than a distance G1 (refer to FIGS. 2 and 4) between the surface of the general portion (other than the flange portion 75) of the columnar member assembly 78 and the inner peripheral surface IS of the electrode through hole 22. Preferably, the distance G2 between the surface of the flange portion 75 and the inner peripheral surface IS of the electrode through hole 22 is 0.1 mm or greater and 2 mm or less, and, more preferably, 0.7 mm or greater and 1.8 mm or less, and most preferably, 1.0 mm or greater and 1.5 mm or less.

A-4. Effect of First Embodiment

As described above, the heating device 100 according to the present embodiment includes the holding member 10 having a plate-like shape with the holding surface S1 and the back surface S2 substantially orthogonal to a predetermined direction (the vertical direction), where the holding member 10 has the resistive heating element 50 thereinside, and the columnar support member 20 having a columnar shape extending in the predetermined direction (the vertical direction) and joined to the back surface S2 of the holding member 10, where the columnar support member 20 has the plurality of electrode through holes 22 having openings formed on the back surface S2 side of the holding member 10. The heating device 100 heats an object, such as a semiconductor wafer W, held on the holding surface S1 of the holding member 10. The heating device 100 further includes the plurality of power receiving electrodes 54 which are disposed on the back surface S2 side of the holding member 10 and are electrically connected to the resistive heating element 50 and a plurality of electrode terminal units 70 each disposed in one of a plurality of the electrode through holes 22 and electrically connected to one of the plurality of power receiving electrodes 54. Each of the electrode terminal units 70 includes the metal stranded wire 73, the first columnar member 71 which is a columnar conductive member disposed closer to the holding member 10 than the metal stranded wire 73, where one end portion (the joint portion CP1) of the first columnar member 71 on the holding member 10 side is joined to the power receiving electrode 54 via the brazing filler metal 56 and the other end portion (the joint portion CP2) is connected to the metal stranded wire 73, and the second columnar member 72 which is a columnar conductive member disposed farther away from the holding member 10 than the metal stranded wire 73, where one end portion (the joint portion CP3) of the second columnar member 72 on the holding member 10 side is joined to the metal stranded wire 73. In each of the electrode terminal units 70, the second columnar member 72 has a substantially cylindrical shape, and the flange portion 75 protruding in a direction orthogonal to the extending direction of the second columnar member 72 is formed in the second columnar member 72. That is, each of the columnar member assemblies 78 (the structure including a portion of the first columnar member 71 other than the joint portion CP1 between the first columnar member 71 and the power receiving electrode 54 and the joint portion CP2 between the first columnar member 71 and the metal stranded wire 73 and a portion of the second columnar member 72 other than the joint portion CP3 between the second columnar member 72 and the metal stranded wire 73) has a general portion (a portion other than the flange portion 75) and the flange portion 75 (a large-diameter portion) having an outer diameter larger than the general portion. The distance G2 between the surface of the flange portion 75 and the inner peripheral surface IS of the electrode through hole 22 is smaller than the distance G1 between the surface of the general portion and the inner peripheral surface IS of the electrode through hole 22.

As described above, according to the heating device 100 of the present embodiment, the columnar member assembly 78 of each of the electrode terminal units 70 has the flange portion 75 having a relatively large diameter. Accordingly, excessive swinging of each of the electrode terminal units 70 can be prevented due to interference between the flange portion 75 and the inner peripheral surface IS of the electrode through hole 22. As a result, the stress of the joint portion CP1 (the brazed portion) between the electrode terminal unit 70 and the power receiving electrode 54 can be reduced and, thus, the risk of damage to the joint portion CP1 can be reduced.

Note that by increasing the diameter of each of the electrode terminal units 70 throughout its entire length in the extending direction, the size of the joint portion CP1 between the electrode terminal unit 70 and the power receiving electrode 54 can be increased and, thus, the risk of damage to the joint portion CP1 caused by swinging of the electrode terminal unit 70 can be reduced. However, in this case, the amount of heat that escapes from the holding member 10 via the electrode terminal units 70 increases, and the uniformity of the temperature of the holding surface S1 (the surface thermal uniformity) of the heating device 100 is likely to decrease. According to the heating device 100 of the present embodiment, since a portion of each of the electrode terminal units 70 other than the flange portion 75 has relatively small diameters, the amount of heat that escapes through the electrode terminal unit 70 can be effectively reduced. Therefore, according to the heating device 100 of the present embodiment, by reducing the amount of heat that escapes through the electrode terminal units 70, a decrease in the surface thermal uniformity of the holding surface S1 can be suppressed. At the same time, excessive swinging of the electrode terminal unit 70 can be prevented due to interference between the flange portion 75 and the inner peripheral surface IS of the electrode through hole 22. In this manner, the stress of the joint portion CP1 between the electrode terminal unit 70 and the power receiving electrode 54 is reduced and, thus, the risk of damage to the joint portion CP1 can be reduced.

In addition, according to the heating device 100 of the present embodiment, the flange portion 75 is formed in the center portion among the three portions defined by equally dividing the second columnar member 72 in the extending direction. Accordingly, unlike the configuration in which the flange portion 75 is formed at an end portion of the above-described three portions, swinging of the electrode terminal unit 70 can be effectively reduced by the flange portion 75. Thus, the risk of damage to the joint portion CP1 between the electrode terminal unit 70 and the power receiving electrode 54 can be effectively reduced.

Furthermore, according to the heating device 100 of the present embodiment, the flange portion 75 is formed in the second columnar member 72 but not in the first columnar member 71. Since the first columnar member 71 is closer to the holding member 10 having a high temperature than the second columnar member 72, the first columnar member 71 is susceptible to, for example, the influence of the above-described difference in amount of thermal expansion. Accordingly, if the flange portion 75 is formed on the first columnar member 71, the flange portion 75 may interfere with the inner peripheral surface IS of the electrode through hole 22 due to the effect of the difference in amount of thermal expansion or the like even when the electrode terminal unit 70 swings to such a small extent that the swing does not cause damage to the joint portion CP1. Thus, the electrode terminal unit 70 may be damaged. In contrast, since the second columnar member 72 is located farther away from the holding member 10 which is heated to a high temperature than the first columnar member 71 and below the metal stranded wire 73 which is flexible (at a position remote from the holding member 10), the second columnar member 72 is less likely to be affected by the difference in amount of thermal expansion or the like. According to the heating device 100 of the present embodiment, since the flange portion 75 is formed on the second columnar member 72 which is less likely to be affected by such a difference in amount of thermal expansion or the like, interference of the flange portion 75 with the inner peripheral surface IS of the electrode through holes 22 can be suppressed when the electrode terminal unit 70 swings a little. Consequently, the risk of damage to the electrode terminal unit 70 can be reduced.

Furthermore, according to the heating device 100 of the present embodiment, the length L1 of the first columnar member 71 in the extending direction is smaller than the length L2 of the second columnar member 72 in the extending direction. Therefore, the metal stranded wire 73 is disposed at a position relatively close to the holding member 10 which is heated to a high temperature, and the stress generated in the electrode terminal unit 70 due to, for example, the difference in amount of thermal expansion is effectively relieved by the metal stranded wire 73. Consequently, the risk of damage to the electrode terminal unit 70 can be effectively reduced.

Still furthermore, according to the heating device 100 of the present embodiment, the columnar support member 20 is a single ceramic member having a plurality of electrode through holes 22 formed therein. Accordingly, for example, the number of parts can be reduced as compared to a configuration in which a plurality of similar electrode through holes 22 are formed by using a plurality of insulating tubes disposed in a hollow portion of a cylindrical ceramic body. In addition, the load imposed on each of the electrode terminal units 70 due to swing of the insulating tube can be eliminated. As a result, the risk of damage to the electrode terminal unit 70 can be reduced. In addition, the joint area between the columnar support member 20 and the holding member 10 can be increased and, thus, the columnar support member 20 and the holding member 10 can be firmly joined with each other.

According to the heating device 100 of the present embodiment, the distance between the surface of the flange portion 75 and the inner peripheral surface IS of the electrode through hole 22 is preferably 0.1 mm or greater and 2 mm or less. Such a configuration can suppress interference of the flange portion 75 with the inner peripheral surface IS of the electrode through hole 22 due to the influence of, for example, the difference in amount of thermal expansion. In this manner, the risk of damage to the electrode terminal unit 70 can be reduced. In addition, excessive swinging of the electrode terminal unit 70 can be prevented.

A-5. First Modification of First Embodiment

Figure 6:
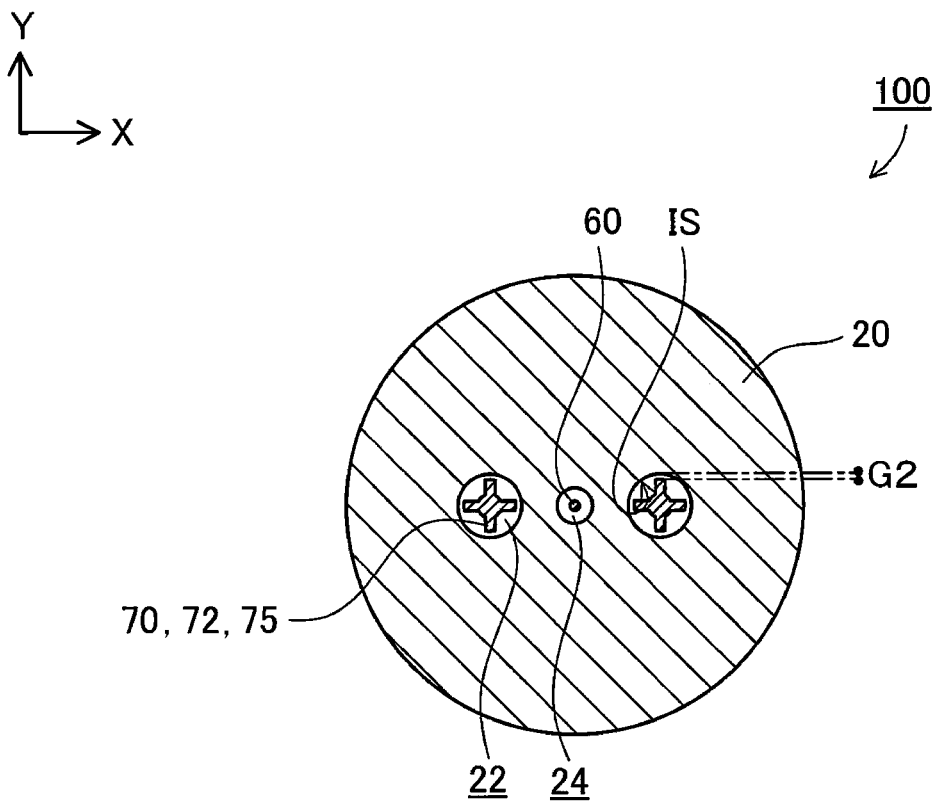
FIG. 6 illustrates the cross-sectional configuration of a heating device according to a first modification of the first embodiment.

FIG. 6 illustrates the cross-sectional configuration of the heating device 100 according to a first modification of the first embodiment. FIG. 6 illustrates the XY cross-sectional configuration of the heating device 100 according to the first modification of the first embodiment at the same position as in FIG. 5. According to the heating device 100 of the first modification of the first embodiment, a flange portion 75 formed in the second columnar member 72 that constitutes the electrode terminal unit 70 has a configuration that differs from the configuration in the heating device 100 according to the first embodiment. More specifically, in the heating device 100 according to the first modification of the first embodiment, the flange portion 75 is formed only in part of the outer periphery of the second columnar member 72 as viewed from the Z-axis direction. In the example illustrated in FIG. 6, the flange portion 75 is formed so as to protrude from the substantially cylindrical portion of the second columnar member 72 in four directions (the positive X-axis direction, the negative X-axis direction, the positive Y-axis direction, and the negative Y-axis direction).

Like the first embodiment, in the heating device 100 according to the first modification of the first embodiment, the distance G2 between the surface of the flange portion 75 and the inner peripheral surface IS of the electrode through hole 22 is smaller than the distance G1 between the surface of the general portion (the portion other than the flange portion 75) of the columnar member assembly 78 and the inner peripheral surface IS of the electrode through hole 22. Thus, even in the heating device 100 according to the first modification of the first embodiment, by reducing the amount of heat that escapes through the electrode terminal units 70, a decrease in the surface thermal uniformity of the holding surface S1 can be suppressed. In addition, excessive swinging of the electrode terminal units 70 can be prevented due to interference between the flange portion 75 and the inner peripheral surface IS of the electrode through-holes 22. In this manner, the stress of the joint portion CP1 between the electrode terminal unit 70 and the power receiving electrode 54 is reduced and, thus, the risk of damage to the joint portion CP1 can be reduced.

A-6. Second Modification of First Embodiment

Figure 7:
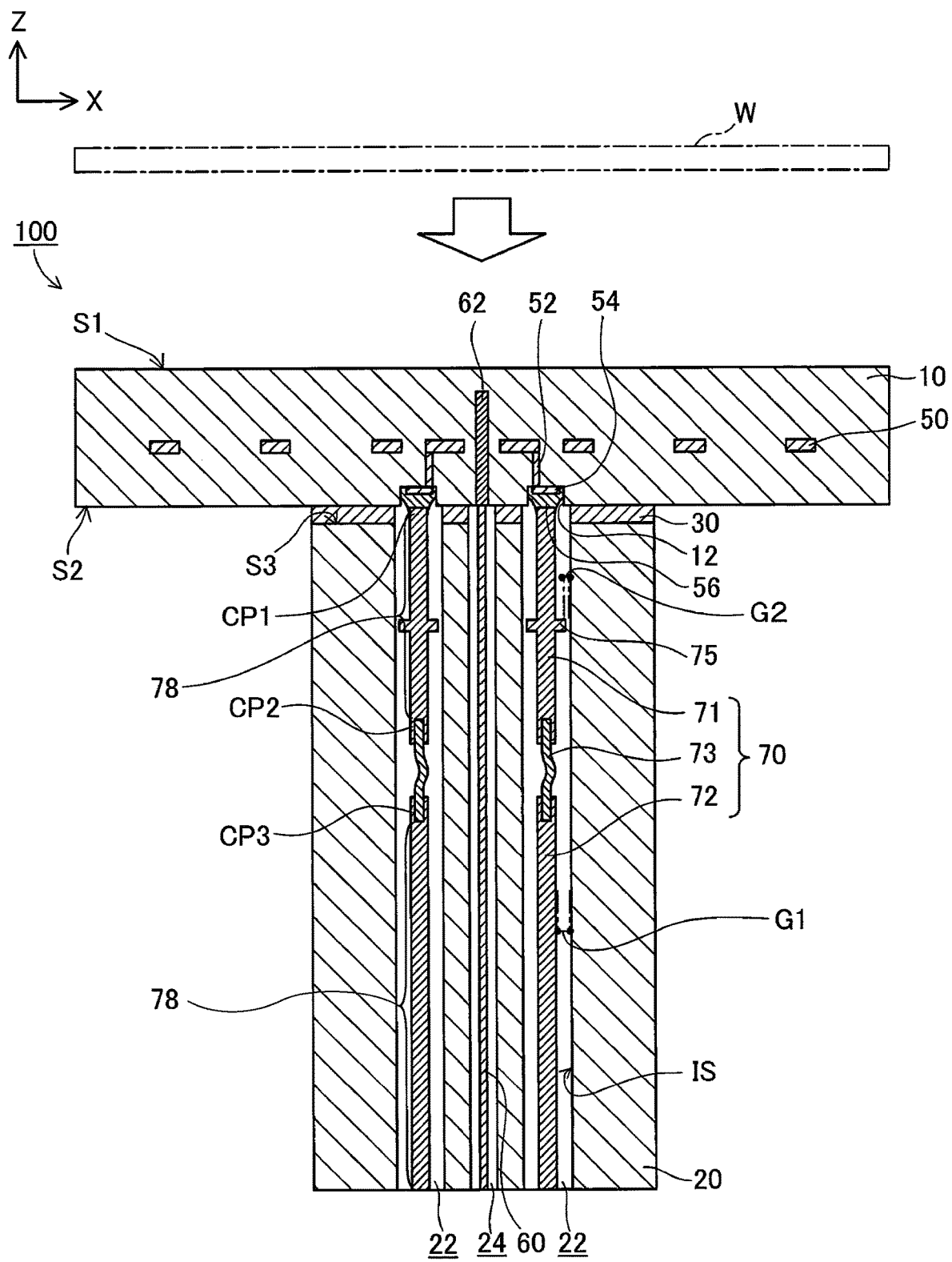
FIG. 7 illustrates the cross-sectional configuration of a heating device according to a second modification of the first embodiment.

FIG. 7 illustrates the cross-sectional configuration of the heating device 100 according to a second modification of the first embodiment. FIG. 7 illustrates the XZ sectional configuration of the heating device 100 according to the second modification of the first embodiment at the same position as in FIG. 2. In the heating device 100 according to the second modification of the first embodiment, the configuration of a flange portion 75 formed in the second columnar member 72 that constitutes the electrode terminal unit 70 differs from that of the above-described heating device 100 according to the first embodiment. More specifically, in the heating device 100 according to the second modification of the first embodiment, the flange portion 75 is formed in the first columnar member 71 instead of in the second columnar member 72. In the example illustrated in FIG. 7, like the above-described first embodiment, the flange portion 75 is provided in the center portion among the three portions defined by equally dividing the first columnar member 71 along the extending direction. In addition, the flange portion 75 is formed around the entire circumference of the first columnar member 71 as viewed from the Z axis direction.

Like the first embodiment, in the heating device 100 according to the second modification of the first embodiment, the distance G2 between the surface of the flange portion 75 and the inner peripheral surface IS of the electrode through hole 22 is smaller than the distance G1 between the surface of the general portion (the portion other than the flange portion 75) of the columnar member assembly 78 and the inner peripheral surface IS of the electrode through hole 22. Accordingly, like the first embodiment, in the heating device 100 according to the second modification of the first embodiment, by reducing the amount of heat that escapes through the electrode terminal units 70, a decrease in the surface thermal uniformity of the holding surface S1 can be suppressed. At the same time, excessive swinging of the electrode terminal unit 70 can be prevented due to interference between the flange portion 75 and the inner peripheral surface IS of the electrode through hole 22. In this manner, the stress of the joint portion CP1 between the electrode terminal unit 70 and the power receiving electrode 54 is reduced and, thus, the risk of damage to the joint portion CP1 can be reduced.

A-7. Third Modification of First Embodiment

Figure 8:
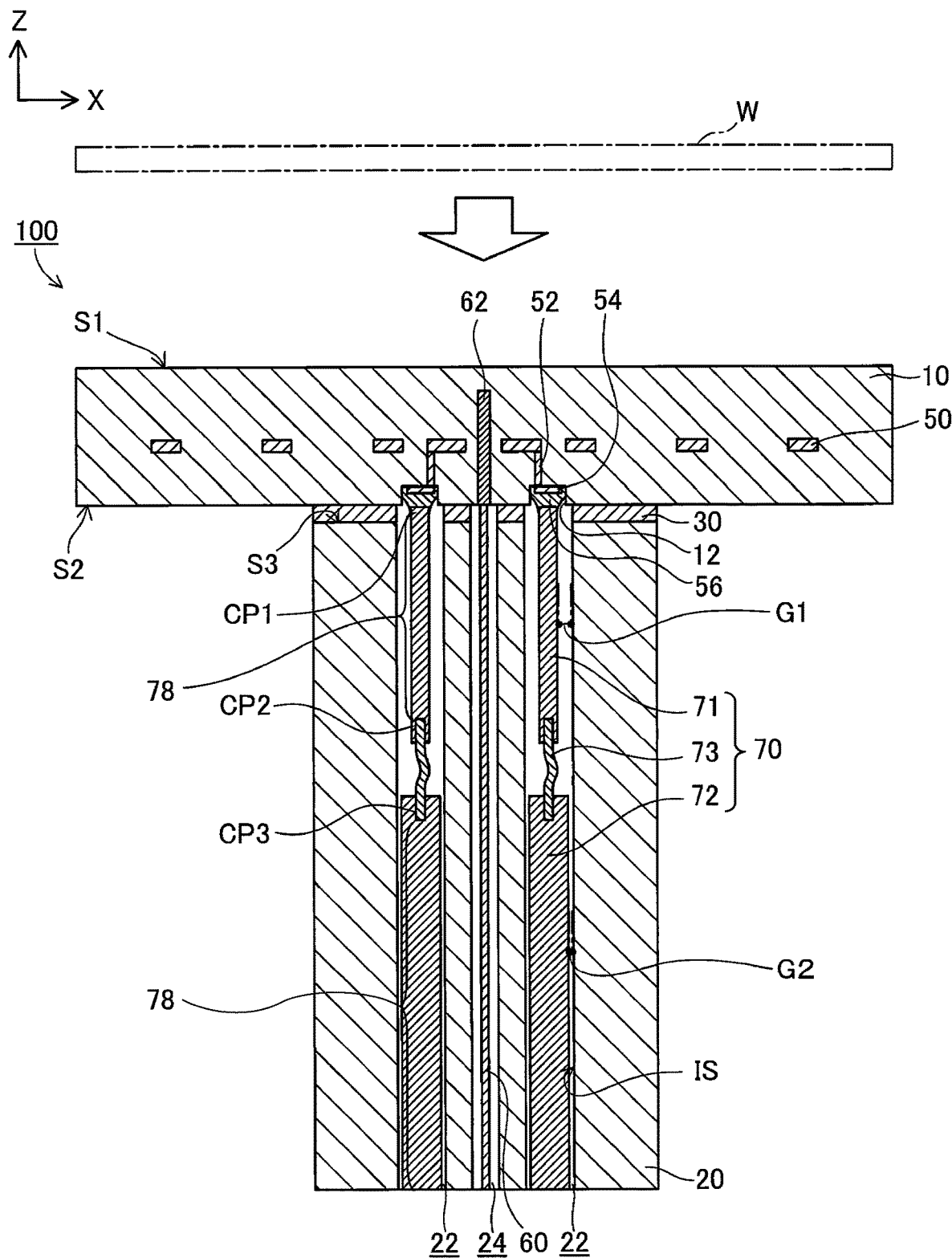
FIG. 8 illustrates the cross-sectional configuration of a heating device according to a third modification of the first embodiment.

FIG. 8 illustrates the cross-sectional configuration of a heating device 100 according to a third modification of the first embodiment. FIG. 8 illustrates the XZ sectional configuration of the heating device 100 according to the third modification of the first embodiment at the same position as in FIG. 2. According to the third modification of the first embodiment, the configuration of the large-diameter portion of the electrode terminal unit 70 of the heating device 100 differs from that in the above-described heating device 100 according to the first embodiment. More specifically, in the heating device 100 according to the third modification of the first embodiment, a large-diameter portion is provided by increasing the diameter of the second columnar member 72 throughout its length in the extending direction instead of providing a large-diameter portion by forming the flange portion 75 in the columnar member assembly 78 of each of the electrode terminal units 70. That is, according to the heating device 100 of the third modification of the first embodiment, the entire second columnar member 72 (other than the joint portion CP3) functions as the large-diameter portion, and the first columnar member 71 (other than the joint portions CP1 and CP2) functions as a general portion.

Like the first embodiment, according to the heating device 100 of the third modification of the first embodiment, the distance G2 between the surface of the large-diameter portion of the columnar member assembly 78 (the portion of the second columnar member 72 other than the joint portion CP3) and the inner peripheral surface IS of the electrode through hole 22 is smaller than the distance G1 between the surface of the general portion of the columnar member assembly 78 (the portion of the first columnar member 71 other than the joint portions CP1 and CP2 in the first columnar member 71) and the inner peripheral surface IS of the electrode through hole 22. Accordingly, like the first embodiment, in the heating device 100 according to the third modification of the first embodiment, by reducing the amount of heat that escapes through the electrode terminal units 70, a decrease in the surface thermal uniformity of the holding surface S1 can be suppressed. At the same time, excessive swinging of the electrode terminal units 70 can be prevented due to interference between the second columnar member 72 and the inner peripheral surface IS of the electrode through hole 22. In this manner, the stress of the joint portion CP1 between the electrode terminal unit 70 and the power receiving electrode 54 is reduced and, thus, the risk of damage to the joint portion CP1 can be reduced. Furthermore, in the heating device 100 according to the third modification of the first embodiment, by simply increasing the diameter of the second columnar member 72 without forming the flange portion 75, a large-diameter portion can be easily provided on the columnar member assembly 78 of each of the electrode terminal units 70. As a result, the manufacturing process can be simplified and sped up and, thus, the manufacturing cost can be reduced.

B. Second Embodiment

Figure 9:
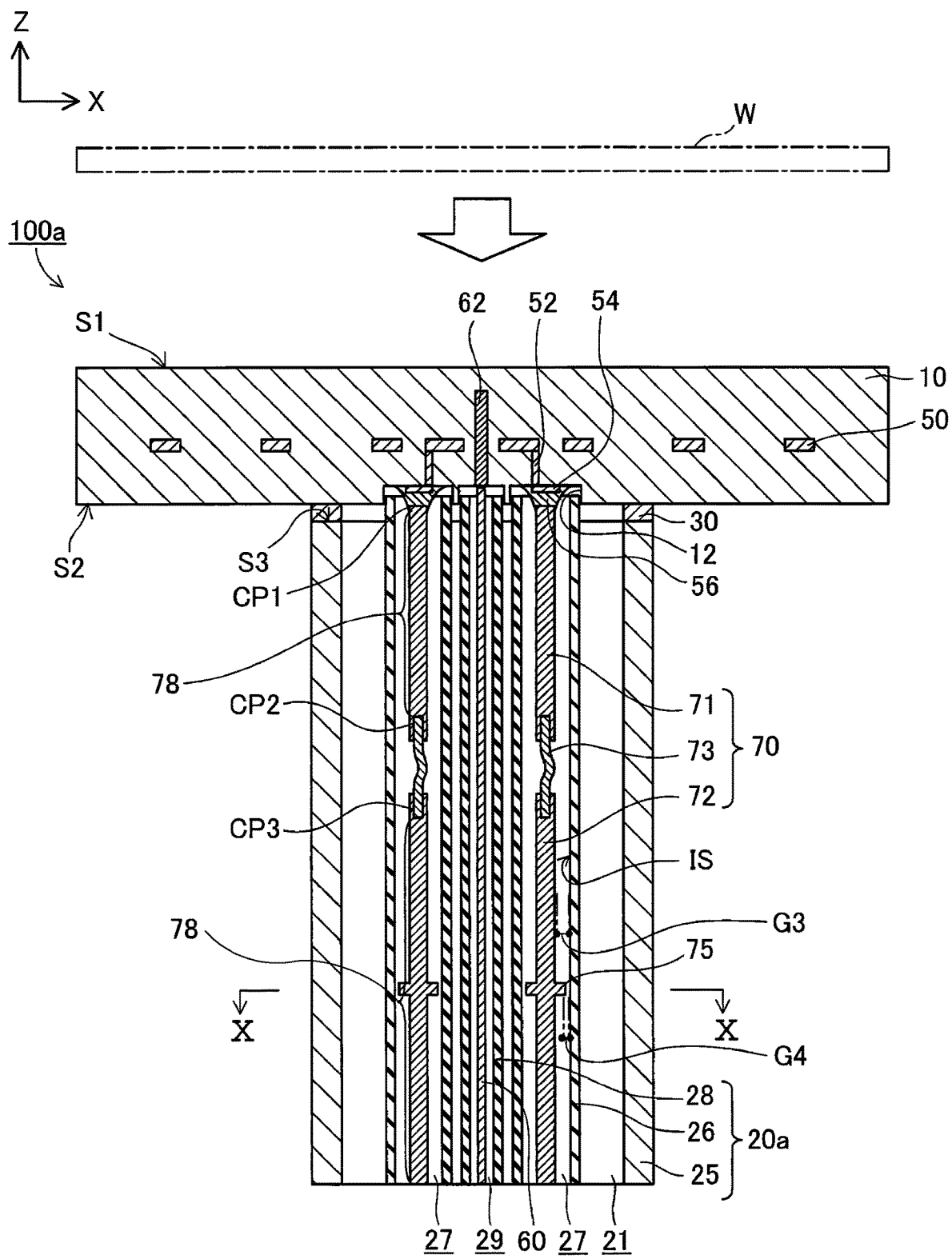
FIG. 9 is a schematic illustration of the cross-sectional configuration of a heating device according to a second embodiment.
Figure 10:
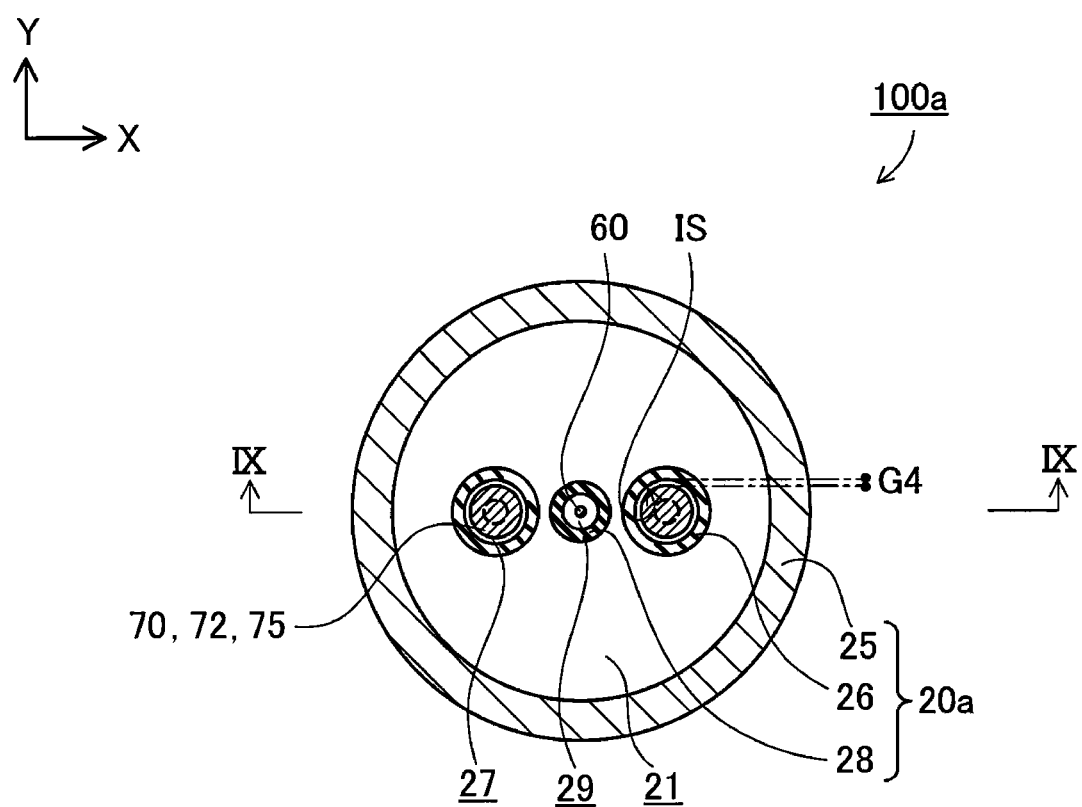
FIG. 10 is a schematic illustration of the cross-sectional configuration of the heating device according to the second embodiment.

FIGS. 9 and 10 are schematic illustrations of the cross-sectional configuration of a heating device 100a according to the second embodiment. FIG. 9 illustrates the XZ cross-sectional configuration of the heating device 100a taken along line IX-IX in FIG. 10 (the same position as in FIG. 2), and FIG. 10 illustrates the XY cross-sectional configuration of the heating device 100a taken along line X-X in FIG. 9 (the same position as in FIG. 5). Hereinafter, the constituent elements of the heating device 100a according to the second embodiment that are identical to the constituent elements of the heating device 100 according to the above-described first embodiment are denoted by the same reference numerals, and the description of the constituent elements is not repeated as appropriate.

As illustrated in FIGS. 9 and 10, the configuration of a columnar support member 20a of the heating device 100a according to the second embodiment differs from the configuration of the columnar support member 20 of the heating device 100 according to the first embodiment described above. More specifically, the columnar support member 20a includes a tubular body 25. The tubular body 25 is a member having a substantially cylindrical shape. The tubular body 25 has a through hole 21 passing therethrough in the vertical direction. The tubular body 25 is made of ceramic mainly containing, for example, AlN or $Al_2O_3$. The tubular body 25 is joined to the back surface S2 of the holding member 10 via the joining layer 30 made of a known joining material.

The through hole 21 of the tubular body 25 has a pair of first insulating tubes 26 and a second insulating tube 28 therein. The first insulating tubes 26 and the second insulating tube 28 are disposed so as to extend in a direction substantially the same as the vertical direction. The upper end portion of each of the first insulating tubes 26 and the second insulating tube 28 is fitted into a corresponding concave portion 12 formed on the back surface S2 of the holding member 10. Thus, movement in the horizontal direction is restricted. The first insulating tubes 26 and the second insulating tube 28 are made of an insulating material.

The second insulating tube 28 has a temperature sensing element through hole 29 formed therein. The temperature sensing element through hole 29 has an opening formed on the back surface S2 side of the holding member 10. The temperature sensing element through hole 29 contains a temperature sensing element 60 having the same configuration as that of the above-described first embodiment.

Each of the first insulating tubes 26 has an electrode through hole 27 formed therein. The electrode through hole 27 has an opening formed on the back surface S2 side of the holding member 10. The electrode through hole 27 is a hole extending in substantially the same direction as the vertical direction and having a substantially circular cross-section with a substantially constant inner diameter throughout its length in the extending direction. As described above, according to the second embodiment, the columnar support member 20a including the tubular body 25 and the pair of first insulating tubes 26 has a columnar shape extending in the vertical direction and is joined to the back surface S2 of the holding member 10. In addition, each of the first insulating tubes 26 provided in the columnar support member 20a has the electrode through hole 27 formed therein, and the electrode through hole 27 has an opening on the back surface S2 side of the holding member 10.

Each of the electrode through holes 27 contains an electrode terminal unit 70 having the same configuration as that of the above-described first embodiment. That is, like the first embodiment described above, in the heating device 100a according to the second embodiment, the second columnar member 72 has a flange portion 75, and the flange portion 75 protrudes in a direction orthogonal to the extending direction of the second columnar member 72. A distance G4 between the surface of the flange portion 75 and the inner peripheral surface IS of the electrode through hole 27 is smaller than a distance G3 between the surface of the general portion of the columnar member assembly 78 (the portion other than the flange portion 75) and the inner peripheral surface IS of the electrode through hole 27.

As described above, like the first embodiment described above, according to the heating device 100a of the second embodiment, in each of the electrode terminal units 70, the second columnar member 72 has a substantially cylindrical shape. The second columnar member 72 has the flange portion 75 formed thereon such that the flange portion 75 protrudes in a direction orthogonal to the extending direction of the second columnar member 72. That is, each of the columnar member assemblies 78 (a structure including a portion of the first columnar member 71 other than the joint portion CP1 between the first columnar member 71 and the power receiving electrode 54 and the joint portion CP2 between the first columnar member 71 and the metal stranded wire 73 and a portion of the second columnar member 72 other than the joint portion CP3 between the second columnar member 72 and the metal stranded wire 73) has a general portion (a portion other than the flange portion 75) and a large-diameter portion (the flange portion 75) having an outer diameter larger than that of the general portion. The distance G4 between the surface of the flange portion 75 and the inner peripheral surface IS of the electrode through hole 27 is smaller than the distance G3 between the surface of the general portion and the inner peripheral surface IS of the electrode through hole 27. Accordingly, like the first embodiment, in the heating device 100a according to the second embodiment, by reducing the amount of heat that escapes through the electrode terminal units 70, a decrease in the surface thermal uniformity of the holding surface S1 can be suppressed. At the same time, excessive swinging of the electrode terminal units 70 can be prevented due to interference between the flange portion 75 and the inner peripheral surface IS of the electrode through hole 27. In this manner, the stress of the joint portion CP1 between the electrode terminal unit 70 and the power receiving electrode 54 is reduced and, thus, the risk of damage to the joint portion CP1 can be reduced.

C. Third Embodiment

Figure 11:
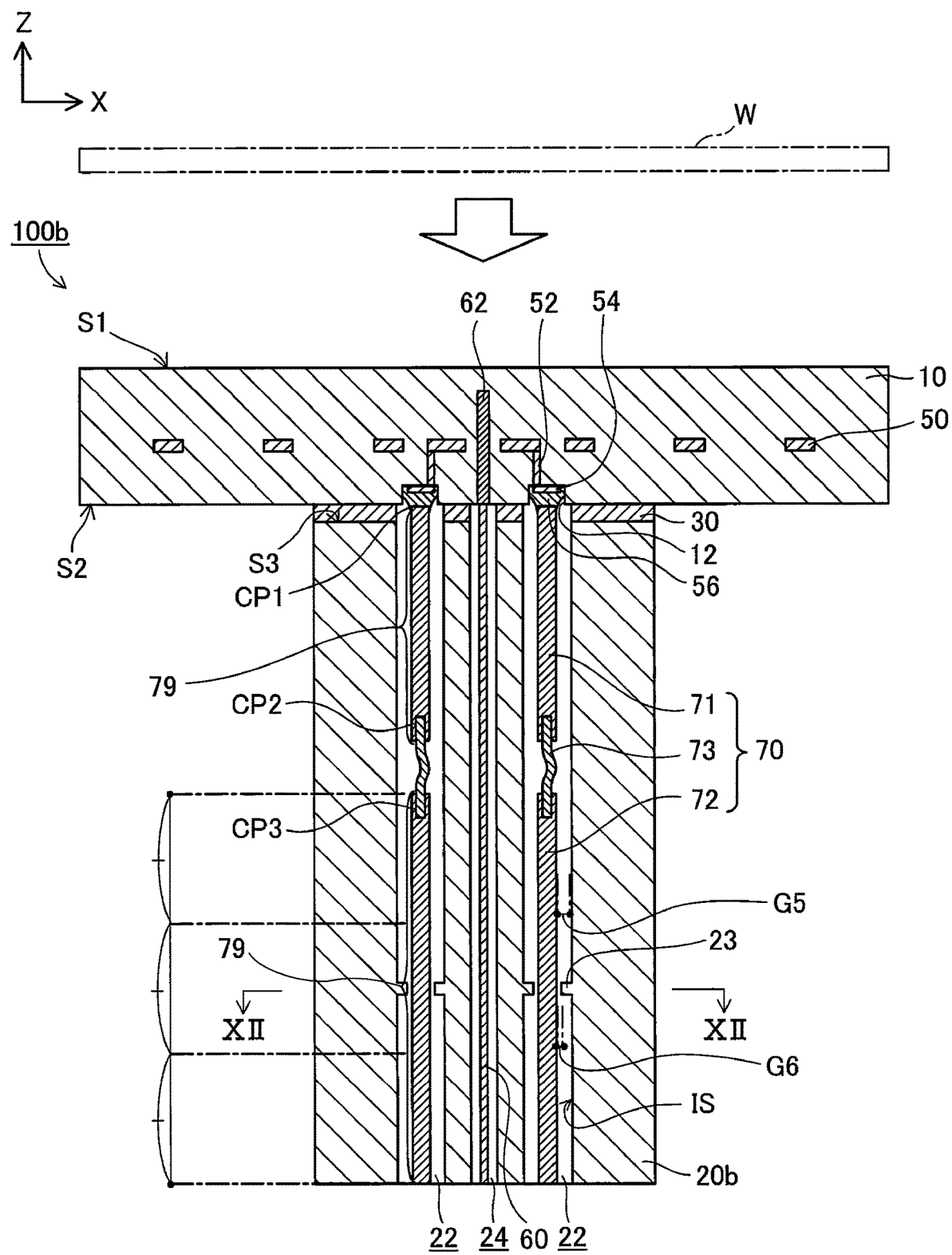
FIG. 11 is a schematic illustration of the cross-sectional configuration of a heating device according to a third embodiment.
Figure 12:
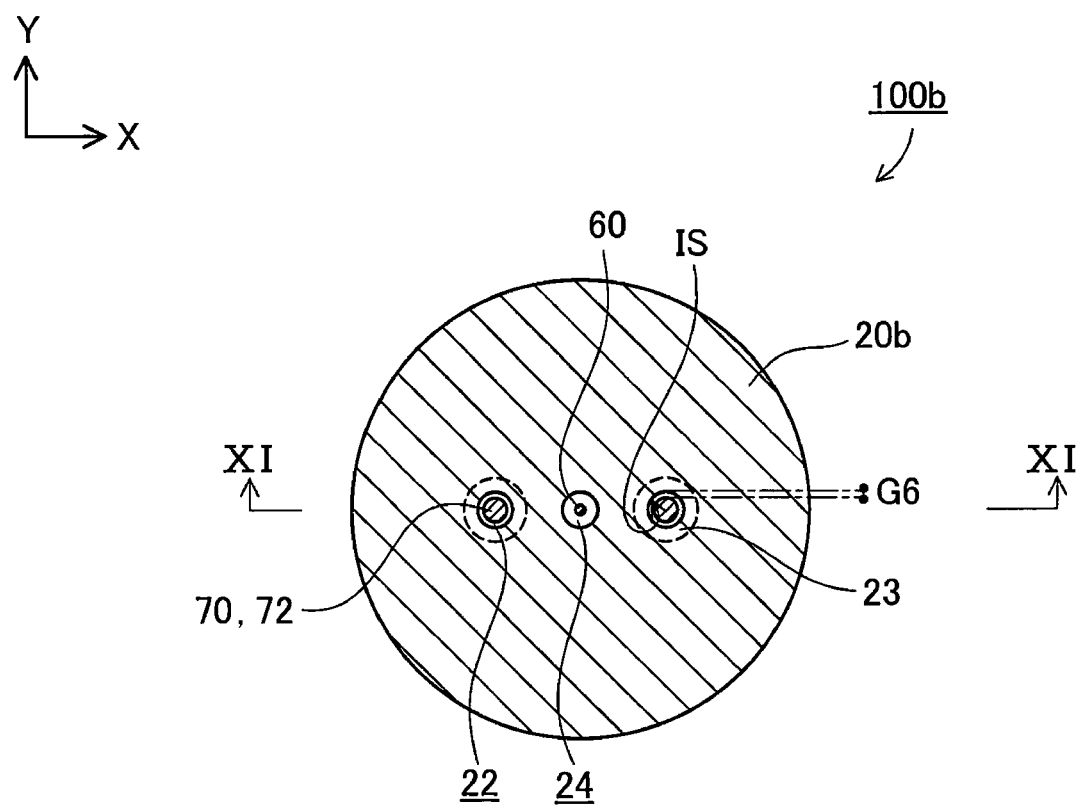
FIG. 12 is a schematic illustration of the cross-sectional configuration of the heating device according to the third embodiment.

FIGS. 11 and 12 are schematic illustrations of the cross-sectional configuration of a heating device 100b according to a third embodiment. FIG. 11 illustrates the XZ cross-sectional configuration of the heating device 100b taken along line XI-XI in FIG. 12 (the same position as in FIG. 2), and FIG. 12 illustrates an XY cross-sectional configuration of the heating device 100b taken along line XII-XII in FIG. 11 (at the same position in FIG. 5). Hereinafter, the constituent elements of the heating device 100b according to the third embodiment that are identical to the constituent elements of the heating device 100 according to the above-described first embodiment are denoted by the same reference numerals, and the description of the constituent elements is not repeated as appropriate.

Hereinafter, in each of the electrode terminal units 70, a structure including a portion of the first columnar member 71 other than the joint portion CP1 between the first columnar member 71 and the power receiving electrode 54 and the second columnar member 72 is referred to as a columnar member structure 79.

As illustrated in FIGS. 11 and 12, according to the heating device 100b of the third embodiment, the diameters of the first columnar member 71 and the second columnar member 72 that constitute each of the electrode terminal units 70 are substantially the same, and the flange portion 75 provided in the first embodiment is not formed. Instead, according to the heating device 100b of the third embodiment, a convex portion 23 is formed on the inner peripheral surface of each of the electrode through holes 22 formed in a columnar support member 20b at a position facing the columnar member structure 79. The thickness of the convex portion 23 (the length in the extending direction of the electrode through hole 22) is preferably, for example, 0.1 mm or greater and 1.0 mm or less. In addition, according to the present embodiment, the convex portion 23 is formed at a position facing the center portion among the three portions defined by equally dividing the second columnar member 72 in the extending direction. Furthermore, as illustrated in FIG. 12, the convex portion 23 is formed around the entire circumference of the inner peripheral surface of the electrode through hole 22 as viewed from the Z-axis direction. The convex portion 23 is formed by using, for example, a rubber mold having a shape corresponding to the convex portion 23 when the columnar support member 20b is produced. Alternatively, the convex portion 23 may be joined to the inner peripheral surface of each of the electrode through holes 22 after the electrode through holes 22 are formed in the columnar support member 20b.

As described above, according to the present embodiment, since the convex portion 23 is formed on the inner peripheral surface IS of each of the electrode through holes 22, a distance G6 between the surface of the convex portion 23 and the columnar member structure 79 is smaller than a distance G5 between the inner peripheral surface IS of the electrode through hole 22 other than the convex portion 23 and the columnar member structure 79. The distance G6 between the surface of the convex portion 23 and the columnar member structure 79 is preferably 0.1 mm or greater and 2 mm or less, and, more preferably 0.7 mm or greater and 1.8 mm or less, and, most preferably, 1.0 mm or greater and 1.5 mm or less.

As described above, according to the heating device 100b of the third embodiment, the convex portion 23 is formed on part of the inner peripheral surface of each of the electrode through holes 22 formed in the columnar support member 20b at a position facing the columnar member structure 79 (the structure including the second columnar member 72 and a portion of the first columnar member 71 other than the joint portion CP1 between the first columnar member 71 and the power receiving electrode 54). The distance G6 between the surface of the convex portion 23 and the columnar member structure 79 is smaller than the distance G5 between the inner peripheral surface of the electrode through hole 22 other than the convex portion 23 and the columnar member structure 79. Thus, according to the heating device 100b of the third embodiment, excessive swinging of the electrode terminal unit 70 can be prevented due to the interference between the convex portion 23 formed on the inner peripheral surface of the electrode through hole 22 and the columnar member structure 79 (the second columnar member 72). As a result, the stress of the joint portion CP1 (the brazed portion) between the electrode terminal unit 70 and the power receiving electrode 54 can be reduced and, thus, the risk of damage to the joint portion CP1 can be reduced.

According to the heating device 100b of the third embodiment, the diameters of the first columnar member 71 and the second columnar member 72 that constitute each of the electrode terminal units 70 need not be increased. Thus, according to the heating device 100b of the third embodiment, by reducing the amount of heat that escapes through the electrode terminal units 70, a decrease in the surface thermal uniformity of the holding surface S1 can be suppressed. At the same time, excessive swinging of the electrode terminal unit 70 can be prevented due to interference between the convex portion 23 formed on the inner peripheral surface IS of the electrode through hole 22 and the columnar member structure 79 (the first columnar member 71). In this manner, the stress of the joint portion CP1 between the electrode terminal unit 70 and the power receiving electrode 54 is reduced and, thus, the risk of damage to the joint portion CP1 can be reduced.

Furthermore, according to the heating device 100b of the third embodiment, the convex portion 23 is formed at a position facing the center portion among the three portions defined by equally dividing the second columnar member 72 in the extending direction. Therefore, unlike a configuration in which the convex portion 23 is formed at a position facing an end portion of the above-mentioned three portions, swinging of each of the electrode terminal units 70 can be effectively suppressed by the convex portion 23. Thus, the risk of damage to the joint portion CP1 between the power receiving electrode 54 and each of the electrode terminal units 70 can be effectively reduced.

In addition, according to the heating device 100b of the third embodiment, the convex portion 23 is formed at a position facing the second columnar member 72, which is less susceptible to the influence of, for example, thermal expansion than the first columnar member 71. Accordingly, interference of the second columnar member 72 with the convex portion 23 can be suppressed when the electrode terminal unit 70 slightly swings and, thus, the risk of damage to each of the electrode terminal units 70 can be reduced.

Note that according to the heating device 100b of the third embodiment, the distance between the surface of the convex portion 23 and the columnar member structure 79 is preferably 0.1 mm or greater and 2 mm or less. In this way, interference of the columnar member structure 79 with the convex portion 23 due to, for example, a difference in thermal expansion can be reduced and, thus, the occurrence of damage to the electrode terminal unit 70 can be reduced. At the same time, excessive swinging of the electrode terminal unit 70 can be prevented.

D. Modifications

The technology disclosed herein is not limited to the above-described embodiments. A variety of modifications of the present embodiments can be made without departing from the spirit and the scope of the technology. For example, the following modifications can be made.

The configuration of the heating device 100 in the above-described embodiments is merely illustrative, and a variety of modifications can be made. For example, while the above embodiments have been described with reference to the holding member 10 and the columnar support member 20 each having a substantially circular outer shape as viewed in the Z-axis direction, the holding member 10 and the columnar support member 20 may have another external shape. In addition, while the above embodiments have been described with reference to the configuration in which the length L1 of the first columnar member 71 that constitutes the electrode terminal unit 70 in the extending direction is shorter than the length L2 of the second columnar member 72 in the extending direction, the length L1 may be the same as or longer than the length L2. Similarly, the shape of the resistive heating element 50 may be different shape.

Furthermore, according to the first embodiment (refer to, for example, FIG. 2), the second modification of the first embodiment (refer to FIG. 7), and the second embodiment (refer to, for example, FIG. 9), the flange portion 75 is formed on only one of the first columnar member 71 and the second columnar member 72. However, the flange portion 75 may be formed on each of the first columnar member 71 and the second columnar member 72. Alternatively, a plurality of flange portions 75 may be provided in one of the first columnar member 71 and the second columnar members 72. Furthermore, the formation position of the flange portion 75 of the first columnar member 71 or the second columnar member 72 can be changed as desired.

According to the third modification of the first embodiment (refer to FIG. 8), the second columnar member 72 constitutes the large-diameter portion of the columnar member assembly 78. However, instead of the second columnar member 72, the first columnar member 71 may constitute the large-diameter portion of the columnar member assembly 78.

Furthermore, according to the above-described third embodiment (refer to, for example, FIG. 11), the convex portion 23 is formed at a position facing the second columnar member 72. However, the convex portion 23 may be formed at a position facing the first columnar member 71 instead of the second columnar member 72. Alternatively, the convex portion 23 may be provided at both positions facing the first columnar member 71 and the second columnar member 72. Still alternatively, a plurality of the convex portions 23 may be provided at positions facing the first columnar member 71 or at positions facing the second columnar member 72.

In addition, according to the first embodiment (including modifications thereof) and the second embodiment, all of the electrode terminal units 70 of the heating device 100 may have a large-diameter portion in the columnar member assembly 78. However, if at least one of the electrode terminal units 70 of the heating device 100 has a large-diameter portion in the columnar member assembly 78, the stress of the joint portion CP1 between the electrode terminal unit 70 and the power receiving electrode 54 can be reduced and, thus, the risk of damage to the joint portion CP1 can be reduced.

In addition, according to the third embodiment, the convex portion 23 that faces the columnar member structure 79 is formed for all of the electrode through holes 22 included in the heating device 100. However, if the convex portion 23 that faces the columnar member structure 79 is formed in at least one of the electrode through holes 22 of the heating device 100, the stress of the joint portion CP1 between the electrode terminal unit 70 inserted into the electrode through hole 22 and the power receiving electrode 54 can be reduced and, thus, the risk of damage to the joint portion CP1 can be reduced.

In addition, the material of each of the members that constitute the heating device 100 according to the above-described embodiments is only illustrative, and each of the members may be formed of another material. For example, according to the heating device 100 of the above-described embodiment, the holding member 10 and the columnar support member 20 are made of ceramic mainly containing aluminum nitride or alumina. However, at least one of the holding member 10 and the columnar support member 20 may be made of another type of ceramic or a material other than ceramic (for example, a metal such as aluminum or an aluminum alloy). Similarly, the electrode terminal unit 70 and the like may be formed of another material.

It should be noted that the method for manufacturing the heating device 100 according to the above-described embodiment is intended to be illustrative only, and various modifications or changes may be made.

What is claimed is:

1. A heating device for heating an object, comprising:
a holding member having a shape of a plate with first and second surfaces substantially orthogonal to a first direction, the holding member including a resistive heating element thereinside, the object being held on the first surface of the holding member;
a columnar support member having a columnar shape extending in the first direction, the columnar support member joined to the second surface of the holding member, the columnar support member including a plurality of inner peripheral surfaces defining a plurality of through holes, each of the plurality of through holes opening at a second surface side of the holding member;
a plurality of power receiving electrodes disposed on the second surface side of the holding member and electrically connected to the resistive heating element; and
a plurality of electrode terminal units, each of the plurality of electrode terminal units disposed in one of the plurality of through holes and electrically connected to one of the plurality of power receiving electrodes, each of the plurality of electrode terminal units including a first columnar member, a metal stranded wire disposed farther away from the holding member than the first columnar member, and a second columnar member disposed farther away from the holding member than the metal stranded wire,
wherein the first columnar member is a conductive member in a columnar shape, one end portion of the first columnar member on the holding member side is joined to the power receiving electrode via a brazing filler metal, and the other end portion is joined to the metal stranded wire,
wherein the second columnar member is a conductive member in a columnar shape, and one end portion of the second columnar member on the holding member side is joined to the metal stranded wire,
wherein in at least one of the electrode terminal units, a columnar member assembly comprises
a portion of the first columnar member other than a joint portion between the first columnar member and the power receiving electrode and a joint portion between the first columnar member and the metal stranded wire, and
a portion of the second columnar member other than a joint portion between the second columnar member and the metal stranded wire, and
wherein the columnar member assembly has
a general portion having a diameter in a predetermined direction, and
a large-diameter portion having a larger diameter in the predetermined direction than the diameter of the general portion, and
wherein a distance between a surface of the large-diameter portion and the respective inner peripheral surface is smaller than a distance between a surface of the general portion and the respective inner peripheral surface such that the electrode terminal unit can swing in the predetermined direction within the respective inner peripheral surface of the columnar support member.

2. The heating device according to claim 1, wherein each of the first columnar member and the second columnar member has a substantially cylindrical shape, at least one of the first columnar member and the second columnar member includes a flange portion protruding in a direction perpendicular to an extending direction of the one of the first columnar member and the second columnar member, and the large-diameter portion comprises the flange portion.

3. The heating device according to claim 2, wherein the at least one of the first columnar member and the second columnar member is trisected into three portions in the extending direction, and the flange portion is located in a center portion.

4. The heating device according to claim 1, wherein the first columnar member has a substantially cylindrical shape with a first diameter and the second columnar member has a substantially cylindrical shape with a second diameter different from the first diameter, and wherein the large-diameter portion comprises the one of the first columnar member and the second columnar member which has a larger diameter.

5. The heating device according to claim 1, wherein the large-diameter portion consists of the second columnar member.

6. The heating device according to claim 1, wherein the first columnar member has a first length in the extending direction and the second columnar member has a second length in the extending direction larger than the first length.

7. The heating device according to claim 1, wherein the distance between the surface of the large-diameter portion and the respective inner peripheral surface is greater than 0.1 mm and 2 mm or less.

8. The heating device according to claim 1, wherein the columnar support member is a single ceramic member having the plurality of through holes defined therein.

9. A heating device for heating an object, comprising:
a holding member having a shape of a plate with first and second surfaces substantially orthogonal to a first direction, the holding member including a resistive heating element thereinside, the object being held on the first surface of the holding member;
a columnar support member having a columnar shape extending in the first direction, the columnar support member joined to the second surface of the holding member, the columnar support member including a plurality of inner peripheral surfaces defining a plurality of through holes, each of the plurality of through holes opening at a second surface side of the holding member;
a plurality of power receiving electrodes disposed on the second surface of the holding member and electrically connected to the resistive heating element; and
a plurality of electrode terminal units, each of the plurality of electrode terminal units disposed in one of the plurality of through holes and electrically connected to one of the plurality of power receiving electrodes, each of the electrode terminal units including a first columnar member, a metal stranded wire disposed farther away from the holding member than the first columnar member, and a second columnar member disposed farther away from the holding member than the metal stranded wire,
wherein the first columnar member is a conductive member in a columnar shape, one end portion of the first columnar member on the holding member side is joined to the power receiving electrode via a brazing filler metal, and the other end portion is joined to the metal stranded wire,
wherein the second columnar member is a conductive member in a columnar shape, one end portion of the second columnar member on the holding member side is joined to the metal stranded wire,
wherein at least one of the plurality of inner peripheral surfaces includes a convex portion that faces a columnar member structure including the second columnar member and a portion of the first columnar member other than a joint portion between the first columnar member and the power receiving electrode, and
wherein a distance between a surface of the convex portion and the columnar member structure is smaller than a distance between the inner peripheral surface other than the convex portion and the columnar member structure.

10. The heating device according to claim 9, wherein the electrode terminal unit can swing in the predetermined direction within the respective inner peripheral surface of the columnar support member.

11. A heating device for heating an object, comprising:
a holding member having a shape of a plate with first and second surfaces substantially orthogonal to a first direction, the holding member including a resistive heating element thereinside, the object being held on the first surface of the holding member;
a columnar support member having a columnar shape extending in the first direction, the columnar support member joined to the second surface of the holding member, the columnar support member including a plurality of inner peripheral surfaces defining a plurality of through holes, each of the plurality of through holes opening at a second surface side of the holding member;
a plurality of power receiving electrodes disposed on the second surface side of the holding member and electrically connected to the resistive heating element; and
a plurality of electrode terminal units, each of the plurality of electrode terminal units disposed in one of the plurality of through holes and electrically connected to one of the plurality of power receiving electrodes, each of the plurality of electrode terminal units including a first columnar member, a metal stranded wire disposed farther away from the holding member than the first columnar member, and a second columnar member disposed farther away from the holding member than the metal stranded wire,
wherein the first columnar member is a conductive member in a columnar shape, one end portion of the first columnar member on the holding member side is joined to the power receiving electrode via a brazing filler metal, and the other end portion is joined to the metal stranded wire,
wherein the second columnar member is a conductive member in a columnar shape, and one end portion of the second columnar member on the holding member side is joined to the metal stranded wire,
wherein in at least one of the electrode terminal units, a columnar member assembly comprises
a portion of the first columnar member other than a joint portion between the first columnar member and the power receiving electrode and a joint portion between the first columnar member and the metal stranded wire, and
a portion of the second columnar member other than a joint portion between the second columnar member and the metal stranded wire, and
wherein the columnar member assembly has
a general portion having a diameter in a predetermined direction, and
a large-diameter portion having a larger diameter in the predetermined direction than the diameter of the general portion, and
wherein the larger-diameter portion is not bonded to the respective inner peripheral surface and a distance between a surface of the large-diameter portion and the respective inner peripheral surface is smaller than a distance between a surface of the general portion and the respective inner peripheral surface.

* * * * *